(12) United States Patent
Nishimoto (10) Patent No.: US 6,623,844 B2
(45) Date of Patent: Sep. 23, 2003

(54) MULTI-LAYER WIRING BOARD AND METHOD OF PRODUCING THE SAME

(75) Inventor: Akihiko Nishimoto, Kokubu (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 10/083,691

(22) Filed: Feb. 25, 2002

(65) Prior Publication Data

US 2002/0162687 A1 Nov. 7, 2002

(30) Foreign Application Priority Data

May 30, 2001 (JP) ........................................ 2001-162933
Feb. 26, 2001 (JP) ........................................ 2001-050978

(51) Int. Cl.$^7$ .............................................. B32B 7/00
(52) U.S. Cl. .................... 428/209; 428/212; 428/215; 428/220; 428/461; 428/447; 428/704; 174/250; 174/251; 174/258; 174/259
(58) Field of Search ................................. 428/209, 212, 428/220, 215, 461, 901, 447, 913, 704; 174/250, 251, 258, 259

(56) References Cited

U.S. PATENT DOCUMENTS 6,143,116 A * 11/2000 Hayashi et al. ............. 156/233

FOREIGN PATENT DOCUMENTS

JP          1-174439    *  7/1989    ............. B32B/7/02

* cited by examiner

Primary Examiner—Deborah Jones
Assistant Examiner—Ling Xu
(74) Attorney, Agent, or Firm—Hogan & Hartson, LLP (57) ABSTRACT

Disclosed is a multi-layer wiring board comprising insulating layers of a thermosetting resin having through-holes formed therein, conductor wiring layers buried in the surfaces of said insulating layers, and via-conductors formed by filling said through-holes with an electrically conducting paste, the via-conductors being electrically connected to said conductor wiring layers, wherein coupling layers comprising a silane coupling agent are formed in the interfaces between said conductor wiring layers and said via-conductors or said insulating layers. The multi-layer wiring board features an increased chemical affinity between the conductor wiring layer and the insulating layer, effectively suppressing the infiltration of water through the interface between the conductor wiring layer and the insulating layer or through the insulating resin, and effectively preventing deterioration in the properties under a high-temperature and high-humidity environment of an extended period of time.

6 Claims, 4 Drawing Sheets

MULTI-LAYER WIRING BOARD AND METHOD OF PRODUCING THE SAME

BACKGROUND OF THE INVENTION

1. Field of the Invention

The present invention relates to a multi-layer wiring board suited for a package for holding a semiconductor device and to a method of producing the same.

2. Description of the Related Art

In recent years, electronic equipment have been produced in ever small sizes. Recent development of portable data terminals and widespread use of a so-called mobile computing operated while carrying a computer with the user, are further demanding a multi-layer wiring board fabricated in a further decreased size, in a more reduced thickness and having more highly dense wiring layers.

There have further been widely used electronic equipment that must operate at high speeds as represented by communication equipment. The demand for a high-speed operation includes a variety of requests such as precise switching for the signals of high frequencies. To cope with such electronic equipment, it has been urged to provide a multi-layer printed wiring board suited for high-speed operation.

To carry out a high-speed operation, it is necessary to shorten the length of the wiring thereby to shorten the time required for the electric signals to propagate. In order to shorten the length of the wiring, it has been demanded to provide a small and thin multi-layer wiring board having wirings of a small width and a highly dense wiring layer having a small gap among the wirings.

In order to cope with a demand for such a highly dense wiring layer, there has been employed a production method called build-up method. Under the JPCA standard, the basic structures of the build-up method can be divided into two, i.e., (1) a base+build-up method, and (2) a whole layer build-up method.

(1) In the base+build-up method, the multi-layer wiring board is produced in a manner as described below.

That is, there is prepared a core board which is an insulating board such as a glass epoxy substrate having, on the surfaces thereof, a conductor wiring layer formed of a metal foil like a copper foil and having, as required, via-conductors.

A photosensitive resin is applied onto the surfaces of the core board and is developed by being exposed to light thereby to form a photosensitive insulating layer having through-holes.

Then, a metal layer such as of copper is plated onto the whole surfaces (inclusive of through-holes) of the photosensitive insulating layer, a photosensitive resist is applied onto the plated layer, which is, then, developed and etched by being exposed to light through a mask of the shape of a circuit pattern to fabricate a conductor wiring layer.

Steps are repeated for applying the photosensitive resin and for forming the conductor wiring layer on the thus formed insulating layer having the conductor wiring layer, thereby to obtain a multi-layer wiring board.

(2) A method of producing a multi-layer wiring board by the whole layer build-up has been disclosed in, for example, Japanese Patent No. 2587593. That is, through-holes are formed in the insulating sheet by a laser and are filled with an electrically conducting paste thereby to form via-conductors in the insulating sheet. Then, a conductor wiring layer is formed on the surface of the insulating sheet so as to be electrically connected to the via-conductors, thereby to obtain a wiring sheet. The thus formed wiring sheet is repetitively laminated thereby to obtain a multi-layer wiring board.

According to the base+build-up method (1), however, the photosensitive epoxy resin used for forming the insulating layer has a low glass transition point and is sensitive to light involving such a defect that it absorbs water much. That is, when left to stand under high-temperature and high-humidity conditions, the multi-layer wiring substrate obtained according to this method arouses a problem of decreased insulation. It can be further contrived to form an insulating layer by using a resin which absorbs water little, such as an arylated polyphenylene ether (A-PPE) resin or a BT (bismaleimidetriazine) resin instead of using the epoxy resin. However, the resin which absorbs water little has a low polarity and exhibits poor wettability to the surface of a metal which has a high polarity. That is, with the multi-layer wiring board in which the insulating layer is formed of a resin that absorbs little water, the adhesion or intimate contact is not accomplished between the insulating layer and the conductor wiring layer, very easily permitting the passage of water that is a factor for deteriorating the characteristics of the wiring board. When the pitch is decreased among the via-conductors that are formed in many number in the insulating layer, therefore, the insulating resistance decreases among the via conductors. When the diameter of the through-holes forming the via-conductors is decreased, further, a problem such as an increase in the resistance of the via-conductors appears conspicuously making it very difficult to fabricate a highly dense wiring board.

Further, the surface of the core board is rugged to a degree comparable to the thickness of the conductor wiring layer formed of the copper foil, and the photosensitive resin used for the build-up method is a liquid. Accordingly, ruggedness in the surface of the core board is reflected up to the surface of the multi-layer wiring board that is obtained. Such a multi-layer wiring board is not suited for the applications where flatness is required, such as mounting the silicon chips like flip chips. Through the surface temperature cycle testing and high-temperature high-humidity testing, further, it has been confirmed that the peeling easily occurs on the interface between the core board and the insulating layer that is built up. It is considered that the peeling on the interface stems from the presence of the above-mentioned ruggedness.

A variety of countermeasures have been proposed for solving the above-mentioned problems. The journal "Electronics Mounting Technology", Vol. 14, No. 1, January 1998 teaches a flat multi-layer wiring board obtained by transferring a circuit pattern formed on a stainless steel by the pattern-plating method onto the surface of an insulating layer that is built up relying upon the laminate pressing method. However, the adhering force has not been improved yet between the core board and the insulating layer that is built up still leaving a problem concerning reliability.

According to the whole layer build-up method (2), the via-conductors are formed by filling the through-holes with the electrically conducting paste. Through the reliability testing such as high-temperature standby testing and pressure cooker testing (PCT), however, it has been confirmed that the via-conductors are oxidized causing an increase in the electric resistance. When the pitch of the via-conductors is decreased, further, the insulation resistance among the via-conductors decreases like that of the above-mentioned base+build-up method (1). That is, since the adhering force is poor on the interface between the insulating layer and the conductor wiring layer or the via-conductors, water which is a factor of deterioration easily infiltrates into the insulating resin layer. Besides, water that has infiltrated into the insulating layer further infiltrates into the via-conductors arousing a problem of rise in the resistance of the via-conductors.

SUMMARY OF THE INVENTION

It is therefore an object of the present invention to provide a highly reliable multi-layer wiring board which features an increased adhering force between the conductor wiring layer and the insulating layer, prevents water from infiltrating into the interface between the conductor wiring layer and the insulating layer, prevents water from infiltrating into the via-conductors from the insulating layer, and does not permit characteristics to be deteriorated even after left in a high-temperature and high-humidity environment for extended periods of time.

According to the present invention, there is provided a multi-layer wiring board comprising insulating layers of a thermosetting resin having through-holes formed therein, conductor wiring layers buried in the surfaces of said insulating layers, and via-conductors formed by filling said through-holes with an electrically conducting paste, the via-conductors being electrically connected to said conductor wiring layers, wherein coupling layers comprising a silane coupling agent are formed in the interfaces between said conductor wiring layers and said via-conductors or said insulating layers.

According to the present invention, there is further provided a method of producing multi-layer wiring boards comprising the steps of:

(i) sticking a metal foil onto the surface of a resin film by using an adhesive;

(ii) forming a resist having a wiring pattern on the surface of said metal foil, forming a conductor wiring layer on the surface of the resin film by etching, and removing the resist;

(iii) applying a silane coupling agent onto the upper surface and/or the side surfaces of the conductor wiring layer formed on the resin film;

(iv) forming through-holes in an insulating sheet in the B-stage containing a thermosetting resin, and filling the through-holes with an electrically conducting paste containing a metal powder to thereby form via-conductors;

(v) laminating the resin film on the insulating sheet in such a manner that the conductor wiring layer coated with the silane coupling agent is overlapped on said via-conductors, followed by pressing so that the conductor wiring layer is buried in the surface of the insulating sheet, and peeling off said resin film thereby to transfer said conductor wiring layer onto the surface of the insulating sheet thereby to prepare a wiring sheet; and (vi) laminating said wiring sheet on another wiring sheet, and curing them at one time while applying a pressure.

In the multi-layer wiring board of the present invention, coupling layers comprising a silane coupling agent are present in the interfaces between the conductor wiring layers and the via-conductors or the insulating layers. The coupling layers work to markedly improve the adhesion or intimate contact between the conductor wiring layers and the via-conductors, or to markedly improve the adhesion or intimate contact between the conductor wiring layers and the insulating layers making, as a result, it possible to effectively prevent the infiltration of water and effectively avoiding the deterioration in the characteristics of when, for example, the conductor wiring layers and via-conductors are finely and densely formed.

In the present invention, the coupling layer comprising the silane coupling agent is provided in the interface between the conductor wiring layer and the via-conductors or in the interface between the conductor wiring layer and the insulating layer. In order to increase the adhering force in the interface, it is desired that the surface of the conductor wiring layer on where the coupling layer is provided has been roughened so as to possess a surface roughness (Ra) of not smaller than 0.2 $\mu$m. This enables the conductor wiring layer to firmly mesh with the via-conductors or with the insulating layer, and the adhering force markedly increases between them.

The silane coupling agent forming the coupling layer is in itself an electrically insulating compound. It is therefore desired that the coupling layer formed in the interface between the conductor wiring layer and the via-conductors has a thickness in a range of from 10 to 100 nm. When the coupling layer is thickly formed, reliability in the electric connection may be spoiled between the conductor wiring layer and the via-conductors. Upon roughening the surface of the conductor wiring layer to lie within the above-mentioned range, further, the particles of silane coupling agent enter into the recessed portions in the surface of the conductor wiring layer, and a direct contact is maintained between the conductor wiring layer and the via-conductors effectively avoiding a decrease in the reliability of electric connection between them.

In the present invention, it is desired that the thermosetting resin used for forming the insulating layer has a water-absorbing factor of not larger than 0.1% from the standpoint of suppressing the absorption of water by the wiring board.

Since the conductor wiring layer is buried in the surface of the insulating layer, the multi-layer wiring board of the present invention exhibits excellent smoothness lending itself well for mounting flip chips and, besides, effectively prevents a decrease in the characteristics caused by the infiltration of water. Even when the pitch is decreased among the via-conductors, therefore, the insulation resistance does not decrease among the via-conductors. Even when the diameter of the via-conductors is decreased, the electric conductivity is not deteriorated, either. Therefore, the multi-layer wiring board of the present invention features a high reliability even when fine circuits are highly densely formed.

DETAILED DESCRIPTION OF THE INVENTION (Structure of the Multi-layer Wiring Board)

Figure 1:
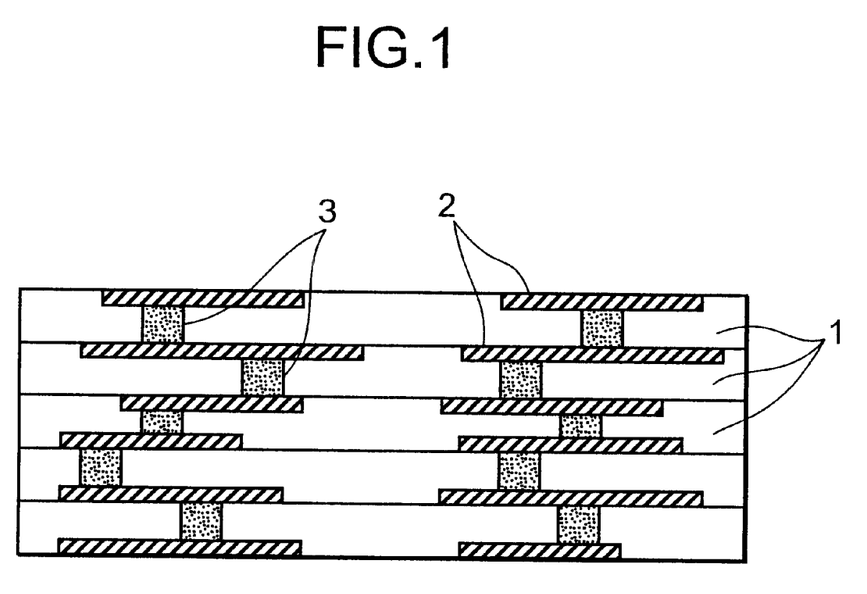
FIG. 1 is a view schematically illustrating, in cross section, the structure of a multi-layer wiring board of the present invention.

Referring to FIG. 1 which schematically illustrates the structure of the multi-layer wiring board of the present invention, a plurality of insulating layers 1 are laminated, and conductor wiring layers 2 are buried in the surfaces of the insulating layers 1. Further, via-conductors 3 are provided in the insulating layers 1 to electrically connect the conductor wiring layers 2 located among different insulating layers.

The insulating layers 1 are formed of a thermosetting resin and are, usually, blended with an inorganic filler to enhance the strength. As the thermosetting resin, there is preferably used the one having a water-absorbing factor of not larger than 0.1% and, particularly, not larger than 0.08%. When the thermosetting resin has a large water-absorbing factor, the electric resistance of the via-conductors 3 may increase being affected by water absorbed by the thermosetting resin, and limitation is imposed on using the multi-layer wiring board in, for example, a high-temperature and high-humidity atmosphere. It is not, therefore, recommended to form the insulating layers by using such a thermosetting resin as an epoxy resin having a large water-absorbing factor. As the thermosetting resin according to the present invention, it is desired to use at least the one selected from the group consisting of A-PPE (arylated polyphenylene ether), BT resin (bismaleimidetriazine), polyimide resin and polyamidebismaleimide. In particular, it is most desired to use the A-PPE.

As the inorganic filler used together with the thermosetting resin, there can be preferably used $SiO_2$, $Al_2O_3$ and AlN generally in a nearly spherical powdery form having an average particle diameter of not larger than 20 μm, preferably, not larger than 10 μm and, most preferably, not larger than 7 μm. It is further allowable to use a fibrous woven fabric or nonwoven fabric such as a glass cloth. In order to increase the strength of the multi-layer wiring substrate, in particular, it is desired that at least one layer among the insulating layers 1 contains a fibrous filler. It is further desired to use a spherical filler when the conductor wiring layers 2 are highly densely and finely formed and when the gap (via pitch) is decreased among the via-conductors 3. It is generally desired that the volume ratio of the thermosetting resin to the inorganic filler in the insulating layers 1 is in a range of from 15:85 to 95:5.

The conductor wiring layers 2 are obtained by forming a metal foil such as copper foil, aluminum foil or silver foil in the shape of a wiring pattern as will be described later and, usually, has a thickness in a range of from 3 to 50 μm.

Figure 2:
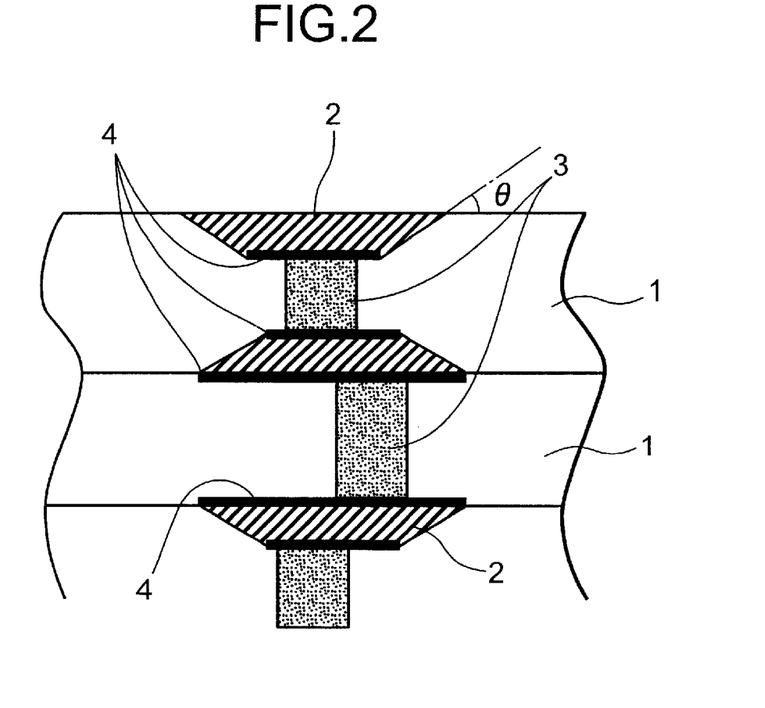
FIG. 2 is a view illustrating, on an enlarged scale, a structure of connection among the conductor wiring layers, via-conductors and insulating layers in the multi-layer wiring board of the present invention.
Figure 3:
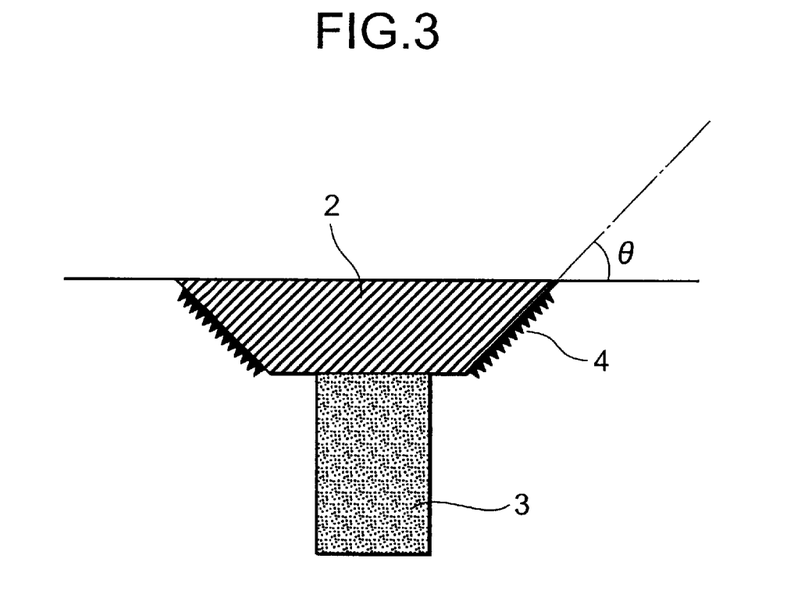
FIG. 3 is a view illustrating, on an enlarged scale, a structure of connection among the conductor wiring layers, via-conductors and insulating layers in the multi-layer wiring board of the present invention.

As shown in FIGS. 2 and 3, further, the conductor wiring layers 2 are buried in the surfaces of the insulating layers 1, and the surfaces of the insulating layers 1 are in flush with the exposed surfaces of the conductor wiring layers 2. Accordingly, the multi-layer wiring board of the present invention exhibits excellent flatness and is suited for the applications where flatness is required, such as mounting the flip chips.

It is further desired that the conductor wiring layers 2 have an inverse trapezoidal shape in cross section, the length of the upper surfaces exposed in the surfaces of the insulating layers 1 being longer than that of the bottom surfaces. The conductor wiring layers 2 having such a shape in cross section are easily buried in the surfaces of the insulating layers 1 and are firmly secured in the surfaces of the insulating layers 1. In this case, it is desired that the side surfaces of the conductor wiring layers 2 are inclined at an angle (θ) of 45 to 80 degrees and, particularly, 50 to 75 degrees with respect to the surfaces of the insulating layers 1. When the angle (θ) of inclination is smaller than the above-mentioned range, the peeling strength of the conductor wiring layers 2 may decrease. That is, the conductor wiring layers 2 may easily peel off the surfaces of the insulating layers 1. When the angle (θ) of inclination is larger than the above-mentioned range, on the other hand, the side surfaces of the conductor wiring layers 2 become short permitting water to easily arrive at the via-conductors 3 from the surfaces of the insulating layers 1 and, hence, permitting the resistance of the via-conductors 3 to increase at a large rate due to the infiltration of water.

The via-conductors 3 are formed by filling the through-holes in the insulating layers 1 with an electrically conducting paste containing a metal powder. As the metal powder, there can be used at least the one selected from gold, silver, copper and aluminum. A binder is used for forming the electrically conducting paste. As the binder, there is preferably used the one which is not volatile but is reactive with the thermosetting resin that is used for forming the insulating layers 1. For example, when the thermosetting resin is an A-PPE, triallylisocyanulate is used as the binder resin, and when the thermosetting resin is a BT resin, an epoxy resin is used as the binder resin. It is further desired that the metal powder and the binder are used at a ratio in a range of from 95:5 to 70:30.

According to the present invention as shown in FIGS. 2 and 3 which are sectional views illustrating major portions on an enlarged scale, a great feature resides in that the coupling layers 4 comprising the silane coupling agent are formed in the interfaces between the conductor wiring layers 2 and the via-conductors 3 (see FIG. 2) or in the interfaces between the conductor wiring layers 2 and the insulating layers 1 (see FIG. 3). It is, of course, allowable to provide the coupling layers 4 in the interfaces between the conductor wiring layers 2 and the via-conductors 3, and in the interfaces between the side surfaces of the conductor wiring layers 2 and the insulating layers 1. That is, according to the present invention, the conductor wiring layers 2 are connected to the via-conductors 3 or to the insulating layers 1 through the coupling layers 4 maintaining a high adhering strength. Even when the multi-layer wiring board is held in a high-temperature and high-humidity environment for extended periods of time, therefore, water is suppressed from infiltrating into the via conductors 3 effectively avoiding a deterioration in the resistance of the via-conductors 3.

In the present invention, the silane coupling agent used for forming the coupling layer 4 may be represented by, for example, the following general formula (1), $$(R^2)_{4-n}\text{---Si---}(OR^1)_n \tag{1}$$

wherein $R^1$ is a hydrogen atom or an alkyl group, $R^2$ is an unsubstituted or substituted monovalent hydrocarbon group, and n is an integer of 1 to 3.

In the above general formula (1), the alkyl group may be a methyl group, an ethyl group, a propyl group, a butyl group, a pentyl group or a hexyl group and, particularly, a lower alkyl group having not more than 4 carbon atoms and, more particularly, a methyl group.

As the unsubstituted or substituted monovalent hydrocarbon group $R^2$, there can be exemplified the above-mentioned alkyl group; alkenyl groups such as a vinyl group, an allyl group and a hexenyl group; aryl groups such as a phenyl group and a tolyl group; aralkyl groups such as a benzyl group and a phenylethyl group; and those groups in which some of the hydrogen atoms are substituted by the substituted or unsubstituted amino groups, glycidyl groups, hydroxyl groups or halogen atoms.

That is, the silane coupling agent having a functional group such as $OR^1$ group exhibits a very high affinity to the thermosetting resin that forms insulating layer 1, via-conductors 3 and conductor wiring layer 2 and, further, has a hydrophobic group such as $R^2$ group, and, hence, effectively shields the infiltration of water.

In the present invention, it is desired that the above-mentioned silane coupling agent has a boiling point (under normal pressure) of not lower than 250° C. When there is used a silane coupling agent having a boiling point of a low temperature, the heat resistance may become low. When a soldering heat resistance testing is conducted, for example, swelling takes place in the interface between the conductor wiring layer 2 and the insulating layer 1, and the via-conductors 3 may exhibit an increased resistance. From such a point of view, the silane coupling agent that is most desirably used in the present invention may be N-phenyl-γ-aminopropyl trimethoxysilane, γ-glycidoxypropyl tri-methoxysilane or N-β(aminoethyl) γ-aminopropyl tri-methoxysilane.

Further, the above-mentioned silane coupling agent is substantially an electrically insulating compound. When the coupling layers 4 are formed in the interfaces between the conductor wiring layers 2 and the via-conductors 3 as shown in FIG. 2, therefore, attention must be given so will not to spoil the electric connection between the conductor wiring layers 2 and the via conductors 3. It is therefore desired that the coupling layer 4 formed in the interfaces has a thickness in a range of from 10 to 100 nm and, particularly, from 20 to 80 nm. By decreasing the thickness of the coupling layer 4 as described above, the conductor wiring layers 2 and the metal particles forming the via-conductors 3 come in contact with each other, and the coupling agent is made present among the metal particles. As a result, the electric connection is maintained between the conductor wiring layer 2 and the via-conductors 3. When the thickness of the coupling layer 4 is larger than the above range, for example, the contact is impaired between the conductor wiring layers 2 and the metal particles forming the via-conductors 3, and the electric resistance may increase between the conductor wiring layers 2 and the via-conductors 3. When the thickness of the coupling layer 4 is smaller than the above range, the advantage of the provision of the coupling layer 4 becomes small.

As for the coupling layer 4 formed in the interface between conductor wiring layer 2 and the insulating layer 1 shown in FIG. 3, there is no limitation on the thickness thereof; i.e., the coupling layer 4 usually has a thickness from about 10 nm to about 1 μm.

In the present invention, further, it is desired that the conductor wiring layers 2 in the portions where the coupling layers 4 are formed have a surface roughness (Ra) of not smaller than 0.2 μm and, particularly, from 0.4 to 1.0 μm. With the surfaces of the conductor wiring layers 2 being roughened as described above, the conductor wiring layers 2 firmly mesh with the via-conductors 3 or the insulating layers 1 through the coupling layers 4, making it possible to further increase the adhesion or intimate contact between the conductor wiring layers 2 and the via-conductors 3 or the insulating layers 1. When the coupling layers 4 are provided in the interfaces between the conductor wiring layers 2 and the via-conductors 3, the coupling agent enter into the recessed portions of the conductor wiring layers 2 making it possible to reliably maintain the electric connection between the conductor wiring layers 2 and the via-conductors 3.

(Production of the Multi-layer Wiring Board)

The above-mentioned multi-layer wiring board of the present invention is produced through the following steps (i) to (vi) that are shown in FIGS. 4 to 6.

Figure 4A:
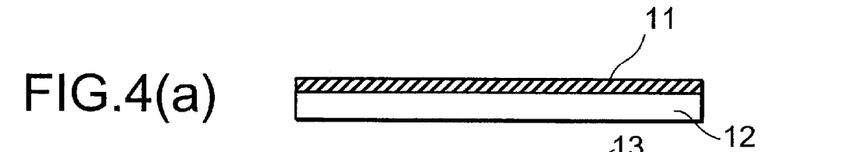
FIGS. 4 to 6 are views illustrating a method of producing the multi-layer wiring board of the present invention.

Step (i):

Referring, first, to FIG. 4(a), a metal foil 11 is stuck to the surface of the resin film 12 via an adhesive.

The metal foil 11 forms the above-mentioned conductor wiring layers 2 and is, preferably, a copper foil by taking into consideration an easy formation of the wiring layer pattern and electric resistance.

There is no particular limitation on the resin film 12 provided it has a suitable degree of strength, and there can be used a film of a polyester such as polyethylene terephthalate or of a polyolefin such as polyethylene or polypropylene.

The metal foil 11 stuck to the resin film 12 is worked into a wiring pattern relying on a photoresist method at a step that will be described later and is, then, peeled off the resin film 12. Therefore, the adhesive used for sticking the metal foil 11 exhibits excellent resistance against the chemicals and has a suitable degree of adhering force. In general, an acrylic adhesive is preferred.

Step (ii):

Referring next to FIGS. 4(b) to 4(e), a transfer sheet A is prepared for transferring the above-mentioned conductor wiring layer 3 onto the surface of the insulating layer 1.

Figures 4B, 4C, 4D:
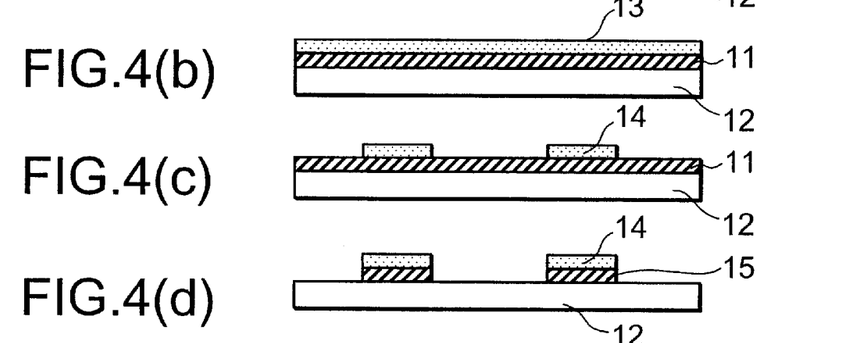

That is, a photoresist 13 is stuck to the metal foil 11 (FIG. 4(b)), exposed to light through a predetermined mask and is, further, developed to leave a photoresist 14 in the shape of a wiring pattern (FIG. 4(c)). Then, the metal foil 11 is etched to remove the portions where no photoresist 14 has been formed, thereby to form a conductor wiring layer 15 (FIG. 4(d)). Thereafter, the photoresist 14 is washed and removed to obtain the transfer sheet A of a resin film having the conductor wiring layer 15 on the surface. That is, the conductor wiring layer 15 corresponds to the conductor wiring layer 2 shown in FIGS. 1 to 3.

In the above step, the photoresist 13 may be either the one of the positive type or the one of the negative type. It is, however, desired to use the one of the negative type in order to easily roughen the conductor wiring layer 15 as will be described later.

Due to the etching, further, the conductor wiring layer 15 that is formed has a shape in cross section that is obtained by inverting the conductor wiring layer 2, and assumes an inverse trapezoidal shape with a side surface of a predetermined angle (θ) of inclination when it is transferred onto the insulating layer. In order that the angle (θ) of inclination of the side surface lies within a predetermined range, the etching is usually conducted at a rate of 2 to 50 μm/min though it may slightly differ depending upon the kind of the metal foil 11.

Figure 4E:
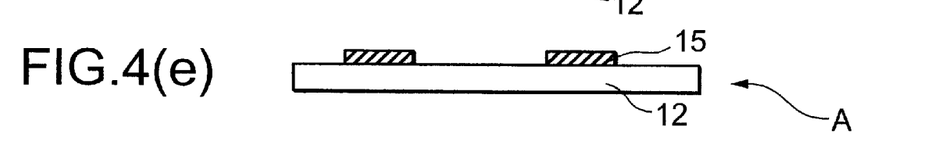

The conductor wiring layer 15 of the thus obtained transfer sheet A is roughened on its surface (upper surface and/or side surfaces) onto where a silane coupling agent that will be described later is to be applied, so that the surface roughness (Ra) becomes not smaller than 0.2 μm. Roughening the surface may vary depending upon the kind of the metal foil. Usually, however, the surface is roughened by being sprayed with an acid or alkaline aqueous solution such as formic acid, $NaClO_2$, NaOH or $Na_2PO_4$, or a mixture solution thereof, or by being dipped in such a solution. It is most desired to spray the formic acid from the standpoint of finely controlling the surface roughness.

Step (iii):

Then, a coating solution containing a silane coupling agent is applied onto the upper surface and/or the side surfaces of the conductor wiring layer 15 of which the surface has been roughened as described above, and is dried to form a silane coupling layer (the silane coupling layer is not shown in FIGS. 4 to 6). That is, the upper surface of the conductor wiring layer 15 comes in contact with the via-conductors 3 in FIG. 1, and the side surfaces of the conductor wiring layer 15 come in contact with the insulating layers 1.

As described already, the thickness of the coupling layer formed by applying the silane coupling agent is adjusted to lie in a predetermined range. The thickness can be easily adjusted by varying the concentration of the coating solution. For example, the coupling layer having a very small thickness is formed on the upper surface of the conductor wiring layer 15 that comes in contact with the via-conductors 3. When such a thin coupling layer is to be formed, it is desired to use a solution of 0.5 to 10% or a solution diluted with an alcohol though it may vary to some extent depending upon the kind of the coupling agent.

Figure 5F:
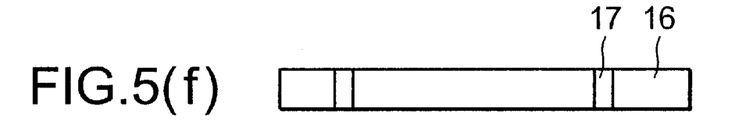

Step (iv):

Referring to FIG. 5(*f*), an insulating sheet 16 is prepared. The insulating sheet 16 forms an insulating layer 1, comprises the above-mentioned thermosetting resin and the inorganic filler, and assumes a half-cured state (B-stage).

The insulating sheet 16 is irradiated with a laser beam at predetermined positions to form through-holes 17 (FIG. 5(*f*)). As the laser beam, there can be preferably used a carbonic acid gas laser, a YAG laser or an excimer laser.

Figure 5G:
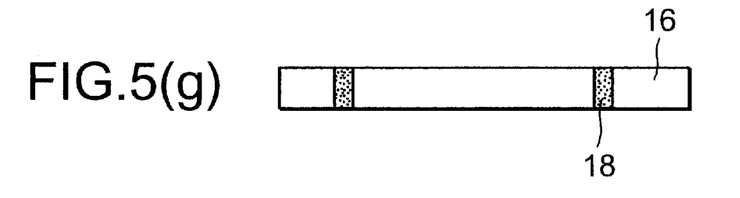

Via-conductors 18 are formed by filling the thus formed through-holes 17 with the above-mentioned electrically conducting paste (FIG. 5(*g*)). The via-conductors 18 correspond to the via-conductors 3 in FIGS. 1 to 3. Though the electrically conducting paste can be filled even by using a normal-pressure printer or the like, it is desired to use a vacuum printer from the standpoint of increasing the filling rate.

Figures 6H, 6I:
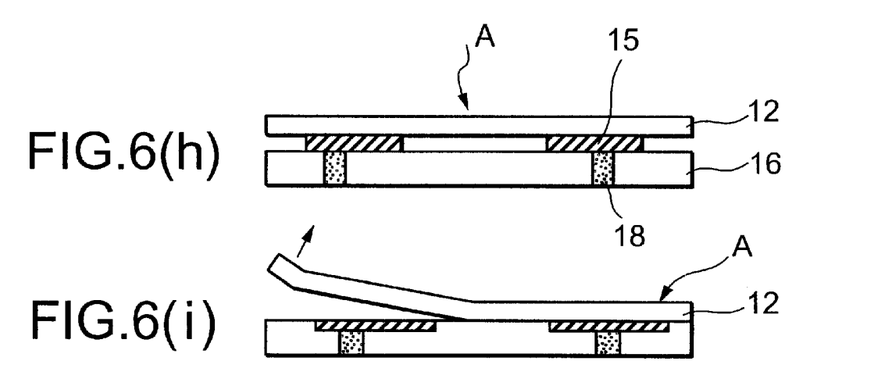
Figure 6J:
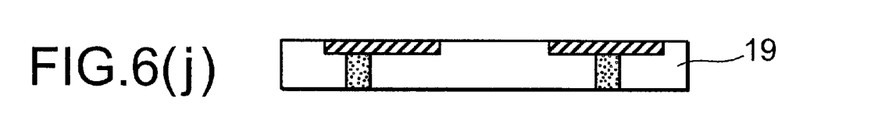

Step (v):

The conductor wiring layer 15 is transferred onto the insulating sheet 16 having via-conductors 18 obtained through the above step (iv) according to a procedure shown in FIGS. 6(*h*) to 6(*j*) by using the transfer sheet A obtained through the steps (i) to (iii) in order to obtain a wiring sheet 19 of a single layer for producing the multi-layer wiring board of FIG. 1.

Namely, the transfer sheet A (resin film 12 having the conductor wiring layer 15) is overlapped on the surface of the insulating sheet 16 in which the via-conductors 18 have been formed, and is press-adhered thereto with a pressure of not smaller than, for example, 3 kg/cm$^2$ (FIG. 6(*h*)). Due to this press-adhesion, the conductor wiring layer 15 is buried in the surface of the insulating sheet 16. In FIG. 6(*h*), the transfer sheet A is overlapped on one surface of the insulating sheet 16. The transfer sheet A, however, may be overlapped on both surfaces of the insulating sheet 16. In this case, the conductor wiring layers 15 are buried in both surfaces of the insulating sheet 16.

After the conductor wiring layer 15 is buried in the surface of the insulating sheet 16 as described above, the resin film 12 is peeled off (FIG. 6(*i*)) thereby to obtain a wiring sheet 19 onto which the conductor wiring layer 15 is transferred, is connected to the via-conductors 18 in the insulating sheet 16, and is firmly joined with its side surfaces to the insulating sheet 16 (FIG. 6(*j*)). When the transfer sheet A is overlapped on both surfaces of the insulating sheet 16, the conductor wiring layers 15 are connected to both ends of the via-conductors 18.

In the wiring sheet 19, further, the upper surface of the conductor wiring layer is exposed to the surface so as to be contacted by the via-conductors when the multi-layer wiring board is fabricated. It is therefore desired that the exposed surface of the conductor wiring layer 15 is roughened in the same manner as described earlier and is coated with the silane coupling agent to form the coupling layer.

Figure 6K:
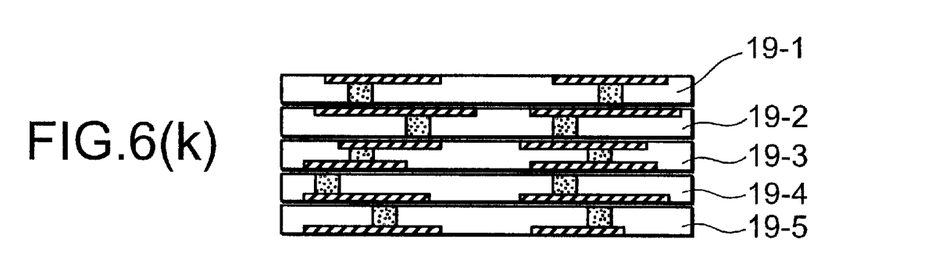

Step (vi):

Then, another wiring sheet that is separately prepared is laminated on the above wiring sheet 19 and is cured at one time to obtain the multi-layer wiring board of the structure shown in FIG. 1 (FIG. 6(*k*)).

Another wiring sheet laminated on the wiring sheet 19 may be the insulating sheet 16 having the via-conductors 18 or the conductor wiring layers 15 as described above, and may have, for example, quite the same structure as the wiring sheet 19 obtained as described above, may be the insulating sheet 16 having the via-conductors 18 only, may be the insulating sheet 16 having the conductor wiring layers 15 buried in one surface thereof, or may be the insulating sheet 16 having the conductor wiring layers 15 buried in both surfaces there.

FIG. 6(*k*) illustrates an example of when five pieces of wiring sheets 19-1 to 19-5 are laminated on upon another. In this example, the wiring sheets 19-1 and 19-2 have the conductor wiring layers 15 buried in the upper surfaces only thereof, the wiring sheet 19-3 has the conductor wiring layers 15 buried in both surfaces thereof, and the wiring sheets 19-4 and 19-5 have the conductor wiring layers 15 buried in the lower surfaces only thereof. The present invention is in no way limited to the above-mentioned laminated layer structure only, as a matter of course. It can be understood that when there are used two pieces of the wiring sheets 19-4 having the conductor wiring layers 15 buried in both surfaces thereof and when another wiring sheet is interposed between these wiring sheets, this another sheet may not be provided with the conductor wiring layer 15 but may have the via-conductors 18 only.

In the example of FIG. 6(*k*), further, there is no need of forming the silane coupling layer on the exposed surfaces of the conductor wiring layers 15 in the uppermost wiring sheet 19-1 and in the lowermost wiring sheet 19-5. This is because no via-conductor is connected to these portions.

As described above, there can be obtained the multi-layer wiring boards of the invention having a variety of layer structures.

The multi-layer wiring board of the present invention suppresses the infiltration of water into the via-conductors. Therefore, the resistance of the via-conductors does not increase even after the multi-layer wiring substrate is placed in a high-temperature and high-humidity condition for extended periods of time and, besides, the insulation among the via-conductors is effectively suppressed from being deteriorated. Accordingly, the multi-layer wiring board of the invention features a very high reliability, is suited for forming highly dense conductor wiring layers of fine shapes, features excellent flatness and is suited for the applications for mounting the flip chips.

EXAMPLES

Experiment 1:

An arylated polyphenylene ether resin (A-PPE) or a BT resin was used as a thermosetting resin and a spherical silica was used as an inorganic filler.

A resin composition was prepared containing the above thermosetting resin and the inorganic filler at a volume ratio of 50:50, and from which an insulating sheet in the B-stage having a thickness of 40 $\mu$m was prepared based on the doctor blade method.

By using a $CO_2$ laser, through-holes having a diameter of 100 $\mu$m or 50 $\mu$m were formed in the insulating sheet. Then, the through-holes were filled with an electrically conducting paste obtained by mixing a copper powder of which the surfaces are coated with silver and a binder, thereby to prepare an insulating sheet B for forming an insulating layer.

On the other hand, a film with a copper foil for transfer was prepared by sticking an electrolytic copper foil of a thickness of 12 μm to a PET film of a thickness of 38 μm. A dry film resist was stuck to the surface of the copper foil, exposed to light, developed with sodium carbonate, and was etched with ferric chloride to form a conductor wiring layer of a trapezoidal shape having side surfaces of an angle of inclination of from 45° to 80°. Thereafter, the resist was peeled off with sodium hydroxide, and a wiring pattern of the conductor wiring layer was formed on the PET film. Then, the surface of the conductor wiring layer was roughened with 10% formic acid to a surface roughness (Ra) of 0.4 μm.

A coupling agent coating solution which is an aqueous solution containing 1 to 20% of N-phenyl-γ-aminopropyltrimethoxysilane or N-β(aminoethyl)γ-aminopropyltrimethoxysilane was applied to the surface of the conductor wiring layer in contact with the via-conductors, and was dried at 120° C. to obtain a transfer sheet having a coupling layer of a thickness of 10 to 150 nm formed on the surface of the conductor wiring layer.

Then, two pieces of the transfer sheets were overlapped on both surfaces of the insulating sheet B, press-adhered thereon at 130° C. under 20 kg/cm², and the PET film was peeled off to prepare a wiring sheet A having the conductor wiring layers buried in both surfaces thereof.

In the thus formed wiring sheet A, a coupling layer was similarly formed on the exposed surface of the conductor wiring layer connected to other via-conductors when it corresponds to the insulating layer located inside the multi-layer wiring board that was fabricated.

The thus obtained wiring sheet A and the insulating sheet B onto which the conductor wiring layer has not been transferred were laminated in order of A-B-A-B-A. The laminate was then cured at one time at 200° C. under 20 kg/cm² to fabricate 6-layered wiring boards (samples NOs. 2 to 20).

There was further prepared a transfer sheet without applying the silane coupling agent, the transfer sheet without being provided with the coupling layer on the surface of the conductor wiring layer. There were fabricated 6-layered wiring boards (samples NOs. 1, 21 to 25) in quite the same manner as described above but using this transfer sheet.

The thus obtained multi-layer wiring boards were measured concerning the water-absorbing factors of the thermosetting resins that were used, and were evaluated for their electric conduction or insulation. The results were as shown in Tables 1 and 2. Measurement and evaluation were conducted as described below.

Water-absorbing Factor of the Thermosetting Resin:

A half-cured sheet having a thickness of 100 μm was prepared by using a thermosetting resin used for the fabrication of wiring board. The sheets were laminated in ten layers and were cured to obtain a laminate having a size of 50 mm×50 mm. The laminate was dried at 50° C. for 24 hours and was, then, immersed in water maintained at 23° C. for 24 hours. The weight of the laminate was measured before and after the immersion to calculate the water-absorbing factor according to the following formula, Water-absorbing factor (%)=(difference in the weight of before and after the immersion/weight of before the immersion)×100

Evaluation of Electric Conduction:

The multi-layer wiring boards (samples Nos. 1 to 11) for evaluating the electric conduction contained a total of 800 via-conductors of a diameter of 100 μm which were connected in series through the conductor wiring layer to form a dizzy chain.

The samples for evaluation were measured for their electric resistances of dizzy chains, and were put to a high-temperature standby testing at 150° C. for 1000 hours and to a pressure cooker testing at 130° C., a humidity of 85%, under 2.3 atms for 200 hours. The samples which exhibited a change in the resistance of the dizzy chain before and after the above testings of not larger than 10% were regarded to be acceptable products, and the samples which exhibited a change of larger than 10% were regarded to be defective products. The number of the defective products was evaluated by using 20 samples of each of them.

Evaluation of Insulation:

The multi-layer wiring boards (samples Nos. 12 to 25) for evaluating the insulation have the via-conductors of 100 μm or 50 μm in diameter maintaining a gap (via pitch) of 150 to 250 μm as shown in Table 2.

The samples for evaluation were put to a high-temperature high-humidity bias testing under 130° C. and 85% RH while applying a bias voltage of 5.5 V among the via-conductors. After 196 hours have passed, the samples that exhibited a resistance of not smaller than $10^8$ Ω were regarded to be acceptable products, and the samples that exhibited a resistance of not larger than $10^8$ Ω were regarded to be defective products. The number of the defective products was evaluated by using 20 samples of each of them. The results were as shown in Table 2.

TABLE 1

| Sample No. | Coupling agent | Thickness of coupling layer (nm) | Kind of insulating resin | Water-absorbing factor of insulating resin (%) | Dizzy chain resistance (Ω) | Proportion defective in hi-temperature test | Proportion defective in PCT |
| --- | --- | --- | --- | --- | --- | --- | --- |
| *1 | — | 0 | A-PPE | 0.02 | 12 | 20/20 | 20/20 |
| 2 | N-phenyl-γ-aminopropyl-trimethoxysilane | 10 | A-PPE | 0.02 | 14 | 2/20 | 2/20 |
| 3 | N-phenyl-γ-aminopropyl-trimethoxysilane | 20 | A-PPE | 0.02 | 15 | 0/20 | 0/20 |
| 4 | N-phenyl-γ-aminopropyl-trimethoxysilane | 50 | A-PPE | 0.02 | 15 | 0/20 | 0/20 |
| 5 | N-phenyl-γ-aminopropyl-trimethoxysilane | 60 | A-PPE | 0.02 | 16 | 0/20 | 0/20 |

TABLE 1-continued

| Sample No. | Coupling agent | Thickness of coupling layer (nm) | Kind of insulating resin | Water-absorbing factor of insulating resin (%) | Dizzy chain resistance (Ω) | Proportion defective in hi-temperature test | Proportion defective in PCT |
|---|---|---|---|---|---|---|---|
| 6 | N-phenyl-γ-aminopropyl-trimethoxysilane | 80 | A-PPE | 0.02 | 16 | 0/20 | 0/20 |
| 7 | N-phenyl-γ-aminopropyl-trimethoxysilane | 100 | A-PPE | 0.02 | 20 | 0/20 | 0/20 |
| 8 | N-phenyl-γ-aminopropyl-trimethoxysilane | 120 | A-PPE | 0.02 | 38 | 0/20 | 0/20 |
| 9 | N-phenyl-γ-aminopropyl-trimethoxysilane | 150 | A-PPE | 0.02 | 53 | 0/20 | 0/20 |
| 10 | N-β(aminoethyl)γ-aminopropyltrimethoxysilane | 60 | A-PPE | 0.02 | 17 | 0/20 | 0/20 |
| 11 | N-phenyl-γ-aminopropyl-trimethoxysilane | 60 | BT resin | 0.07 | 16 | 0/20 | 0/20 |

Samples marked with * lie outside the scope of the invention.

TABLE 2

| Sample No. | Via diameter (μm) | Via pitch (μm) | Coupling agent | Kind of insulating resin | Water-absorbing factor of insulating resin (%) | Proportion defective in hi-temp. hi-humid bias test |
|---|---|---|---|---|---|---|
| 12 | 100 | 250 | N-phenyl-γ-aminopropyltrimethoxysilane | A-PPE | 0.02 | 0/20 |
| 13 | 100 | 200 | N-phenyl-γ-aminopropyltrimethoxysilane | A-PPE | 0.02 | 0/20 |
| 14 | 50 | 250 | N-phenyl-γ-aminopropyltrimethoxysilane | A-PPE | 0.02 | 0/20 |
| 15 | 50 | 200 | N-phenyl-γ-aminopropyltrimethoxysilane | A-PPE | 0.02 | 0/20 |
| 16 | 50 | 150 | N-phenyl-γ-aminopropyltrimethoxysilane | A-PPE | 0.02 | 0/20 |
| 17 | 50 | 250 | N-β(aminoethyl)γ-aminopropyltrimethoxysilane | A-PPE | 0.02 | 0/20 |
| 18 | 50 | 200 | N-β(aminoethyl)γ-aminopropyltrimethoxysilane | A-PPE | 0.02 | 0/20 |
| 19 | 50 | 150 | N-β(aminoethyl)γ-aminopropyltrimethoxysilane | A-PPE | 0.02 | 0/20 |
| 20 | 50 | 150 | N-phenyl-γ-aminopropyltrimethoxysilane | BT resin | 0.07 | 0/20 |
| *21 | 100 | 250 | — | A-PPE | 0.02 | 18/20 |
| *22 | 100 | 200 | — | A-PPE | 0.02 | 20/20 |
| *23 | 50 | 250 | — | A-PPE | 0.02 | 15/20 |
| *24 | 50 | 200 | — | A-PPE | 0.02 | 18/20 |
| *25 | 50 | 150 | — | A-PPE | 0.02 | 20/20 |

Samples marked with * lie outside the scope of the invention.

Upon having the coupling agent present on the surfaces of the conductor wiring layers that are in contact with the via-conductors as shown in Tables 1 and 2, there were fabricated a highly dense multi-layer wiring board that did not cause the resistance to increase even through the high-temperature standby testing or the PCT testing and that did not permit the insulation to be deteriorated even through the high-temperature high-humidity bias testing. Further, the multi-layer wiring board of the present invention permitted the insulating layer and the conductor wiring layer to be worked in parallel, and permitted the resins of the insulating layers to be cured at one time, making it possible to greatly shorten the cycle time.

Experiment 2:
(Fabrication of the Multi-layer Wiring Board)

The following materials were used as insulating sheets for forming the insulating layers.

A prepreg comprising a glass fabric and an arylated polyphenylene ether resin (A-PPE resin);

A prepreg comprising a glass fabric and a BT resin;

A sheet in the B-stage having a thickness of 40 μm prepared by using a resin composition containing the A-PPE resin and the spherical silica (inorganic filler) at a volume ratio of 50:50 relying upon the doctor blade method; and A sheet in the B-stage having a thickness of 40 μm prepared by using the BT resin and the spherical silica (inorganic filler) at a volume ratio of 50:50 relying upon the doctor blade method;

Via-conductors were formed in the above insulating sheets in the same manner as in Experiment 1.

A conductor wiring layer of a trapezoidal shape with a side surface of an angle of inclination of 45° to 80° was formed on the PET film in the same manner as in Experiment 1 by using a film with a copper foil for transfer obtained by sticking an electrolytic copper foil of a thickness of 12 μm onto a PET film having a thickness of 38 μm. Then, by using an aqueous solution of 10% of formic acid, the side surfaces of the conductor wiring layer were roughened to a surface roughness Ra of 0.1 to 0.8 μm, and to which was applied N-phenyl-γ-aminopropyltrimethoxysilane or N-β (aminoethyl) γ-aminopropyltrimethoxysilane to form a coupling layer on the side surfaces of the conductor wiring layer. Thereafter, the resist was peeled off by using sodium hydroxide to obtain a transfer sheet having the conductor wiring layer on the PET film.

Next, the transfer sheet was overlapped on one surface of the insulating sheet, press-adhered thereto at 130° C. under 20 kg/cm$^2$, and the PET film was peeled off to obtain a wiring sheet A in which the conductor wiring layer was buried.

The wiring sheets A prepared from the insulating sheet containing the glass fabric were overlapped in four layers, and the laminate was cured at one time under the conditions of 200° C. and 20 kg/cm$^2$ to prepare 4-layer wiring boards (samples Nos. 1 to 15). In the sample No. 9, however, there was used a wiring sheet A obtained by using a transfer sheet prepared without forming the coupling layers on the side surfaces of the conductor wiring layer.

Further, the wiring sheets A prepared from the insulating sheet obtained from the glass fabric and the wiring sheets A prepared from the insulating sheet containing the silica filler, factors of the thermosetting resins in the insulating sheets, and were evaluated for their electric conduction (proportion defective in the high-temperature standby testing and PCT testing). The results were shown in Table 3 together with the surface roughness (Ra) of the side surfaces of the conductor wiring layers and the angles of inclination of side surfaces of the conductor wiring layers. Surface roughness of the side surfaces of the conductor wiring layers were measured by using an atomic force microscope (AFM), and the angles of inclination of side surfaces of the conductor wiring layers were measured by observing the cross section of the conductor wiring layers by using the SEM.

TABLE 3

| Sample No. | Number of layers | Roughness of side surfaces of conductor wiring layer (μm) | Silane couling agent | Insulating resin | Water-absorbing factor of insulating resin (%) | Angle of inclination (°) | Proportion defective in hi-temp test | Proportion defective in PCT |
|---|---|---|---|---|---|---|---|---|
| *1 | 4 | 0.1 | N-phenyl-γ-aminopropyl-trimethoxysilane | A-PPE | 0.02 | 60 | 20/20 | 20/20 |
| 2 | 4 | 0.2 | N-phenyl-γ-aminopropyl-trimethoxysilane | A-PPE | 0.02 | 60 | 1/20 | 2/20 |
| 3 | 4 | 0.3 | N-phenyl-γ-aminopropyl-trimethoxysilane | A-PPE | 0.02 | 60 | 0/20 | 0/20 |
| 4 | 4 | 0.4 | N-phenyl-γ-aminopropyl-trimethoxysilane | A-PPE | 0.02 | 60 | 0/20 | 0/20 |
| 5 | 4 | 0.6 | N-phenyl-γ-aminopropyl-trimethoxysilane | A-PPE | 0.02 | 60 | 0/20 | 0/20 |
| 6 | 4 | 0.8 | N-phenyl-γ-aminopropyl-trimethoxysilane | A-PPE | 0.02 | 60 | 0/20 | 0/20 |
| 7 | 4 | 0.6 | N-β(aminoethyl)γ-aminopropyltrimethoxysilane | A-PPE | 0.02 | 60 | 0/20 | 0/20 |
| *8 | 4 | 0.6 | none | A-PPE | 0.02 | 60 | 20/20 | 20/20 |
| 9 | 4 | 0.6 | N-phenyl-γ-aminopropyl-trimethoxysilane | BT resin | 0.07 | 60 | 0/20 | 0/20 |
| *10 | 4 | 0.6 | N-phenyl-γ-aminopropyl trimethoxysilane | A-PPE | 0.02 | 90 | 20/20 | 19/20 |
| 11 | 4 | 0.6 | N-phenyl-γ-aminopropyl-trimethoxysilane | A-PPE | 0.02 | 80 | 0/20 | 0/20 |
| 12 | 4 | 0.6 | N-phenyl-γ-aminopropyl-trimethoxysilane | A-PPE | 0.02 | 75 | 0/20 | 0/20 |
| 13 | 4 | 0.6 | N-phenyl-γ-aminopropyl-trimethoxysilane | A-PPE | 0.02 | 50 | 0/20 | 0/20 |
| 14 | 4 | 0.6 | N-phenyl-γ-aminopropyl-trimethoxysilane | A-PPE | 0.02 | 45 | 0/20 | 0/20 |
| *15 | 4 | 0.6 | N-phenyl-γ-aminopropyl-trimethoxysilane | A-PPE | 0.02 | 30 | 20/20 | 17/20 |
| *16 | 8 | 0.1 | N-phenyl-γ-aminopropyl-trimethoxysilane | A-PPE | 0.02 | 60 | 20/20 | 19/20 |
| 17 | 8 | 0.6 | N-phenyl-γ-aminopropyl-trimethoxysilane | A-PPE | 0.02 | 60 | 0/20 | 0/20 |
| 18 | 8 | 0.6 | N-β(aminoethyl)γ-aminopropyltrimethoxysilane | A-PPE | 0.02 | 60 | 0/20 | 0/20 |
| 19 | 8 | 0.6 | N-phenyl-γ-aminopropyl-trimethoxysilane | BT resin | 0.07 | 60 | 0/20 | 0/20 |
| *20 | 8 | 0.6 | none | A-PPE | 0.02 | 60 | 20/20 | 20/20 |

Samples marked with * lie outside the scope of the invention.

were alternately overlapped one upon another to obtain a laminate of eight layers. This laminate was cured under the same conditions as those described above to prepare an 8-layer wiring board (samples Nos. 16 to 20). In the sample No. 20, however, there was used a wiring sheet A obtained by using a transfer sheet prepared without forming the coupling layers on the side surfaces of the conductor wiring layer.

Like in Experiment 1, the thus obtained multi-layer wiring boards were measured concerning the water-absorbing As will be understood from the results of Table 3, by forming the coupling layers on the side surfaces of the conductor wiring layer, by setting the angle (θ) of inclination of the side surfaces of the conductor wiring layer to be 45° to 85°, and by setting the surface roughness (Ra) of the side surfaces to be not smaller than 0.2 μm, it is allowed to fabricate a multi-layer wiring board that does not permit the resistance to increase even after having passed through the high-temperature standby testing and the PCT testing.

What is claimed is:

1. A multi-layer wiring board comprising insulating layers of a thermosetting resin having through-holes formed therein, conductor wiring layers buried in the surfaces of said insulating layers, and via-conductors formed by filling said through-holes with an electrically conducting paste, the via-conductors being electrically connected to said conductor wiring layers, wherein coupling layers comprising a silane coupling agent are formed in the interfaces between said conductor wiring layers and said via-conductors or said insulating layers, wherein said conductor wiring layer buried in the surface of said insulating layer has an inverse trapezoidal shape, the length of the upper surface exposed on the surface of the insulating layer being larger than that of the bottom surface as viewed in cross section, and the side surfaces of said conductor wiring layer having an angle of inclination of 45 to 80 degrees with respect to the surface of the insulating layer.

2. A multi-layer wiring board according to claim 1, wherein said silane coupling agent is at least the one selected from the group consisting of N-phenyl-γ-aminopropyltrimethoxysilane, γ-glycidoxypropyltrimethoxysilane, and N-β-(aminoethyl)γ-aminopropyltrimethoxysilane.

3. A multi-layer wiring board according to claim 1, wherein the conductor wiring layer surface in which the coupling layer is formed has a surface roughness (Ra) of not smaller than 0.2 μm.

4. A multi-layer wiring board according to claim 1, wherein said coupling layer formed in the interface between said via-conductors and said conductor wiring layer has a thickness of from 10 to 100 nm.

5. A multi-layer wiring board according to claim 1, wherein said thermosetting resin has a water-absorbing rate of not larger than 0.1% by weight.

6. A multi-layer wiring board according to claim 1, wherein said conductor wiring layer is obtained by forming a metal foil in the shape of a wiring pattern.

* * * * *